United States Patent [19]

Marchetti

[11] 4,195,264

[45] Mar. 25, 1980

[54] NOISE DETECTION CIRCUIT

[75] Inventor: Charles R. Marchetti, Wellesley, Mass.

[73] Assignee: GTE Sylvania Incorporated, Stamford, Conn.

[21] Appl. No.: 899,923

[22] Filed: Apr. 26, 1978

[51] Int. Cl.$^2$ .................. H03K 13/32; H03K 5/20
[52] U.S. Cl. .................... 328/134; 329/122; 328/141
[58] Field of Search .............. 328/134, 141, 155; 329/107, 122, 123

[56] References Cited

U.S. PATENT DOCUMENTS

| | | | |
|---|---|---|---|
| 3,440,540 | 4/1969 | Hane et al. | 328/134 X |
| 4,052,676 | 10/1977 | Crittenden | 328/134 |
| 4,080,576 | 3/1978 | Huber et al. | 328/155 |

*Primary Examiner*—John S. Heyman
*Attorney, Agent, or Firm*—Peter Xiarhos

[57] ABSTRACT

Digital noise detection circuit for detecting the presence of noise in digital diphase data and for producing an alarm signal in response to the detection of such noise. The digital diphase data is applied to circuitry from which a clock signal is extracted and processed to derive a first input signal at a first input of an alarm NAND logic gate. The clock signal is also employed by a digital phase lock loop circuit to produce a second signal at a second input of the alarm NAND logic gate which, in the absence of noise corrupting or otherwise affecting the diphase data, is out of phase with the signal at the first input of the alarm NAND logic gate. As a result, no alarm signal is produced by the alarm NAND logic gate. At such time as the diphase data is affected by noise, the signal at the first input of the alarm NAND logic gate becomes in phase with the signal produced by the phase lock loop circuit at the second input of the alarm NAND logic gate, resulting in the production of an alarm signal by the alarm NAND logic gate. The alarm signal may be employed in any desired manner by circuitry associated with the noise detection circuit.

11 Claims, 12 Drawing Figures

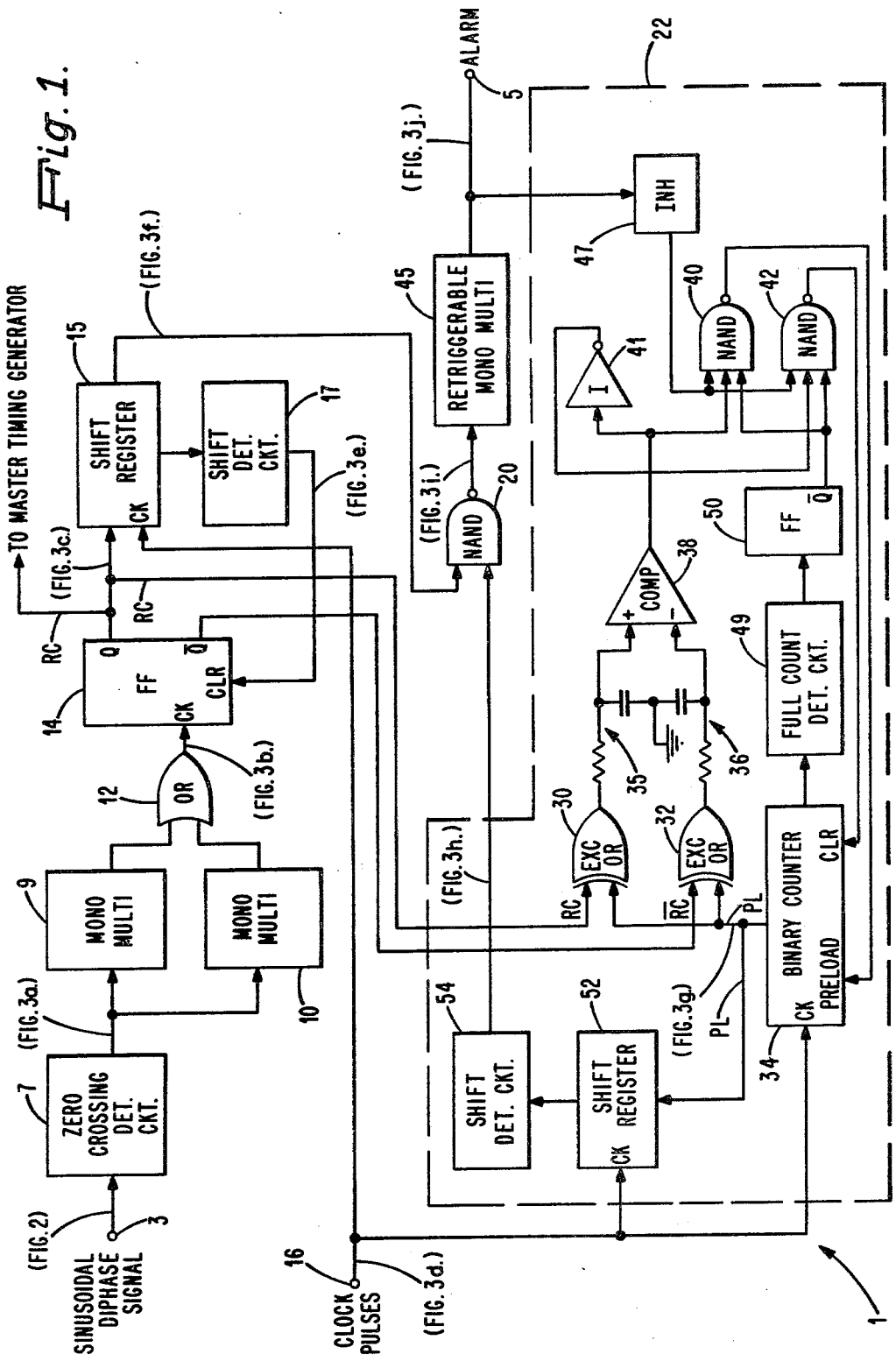

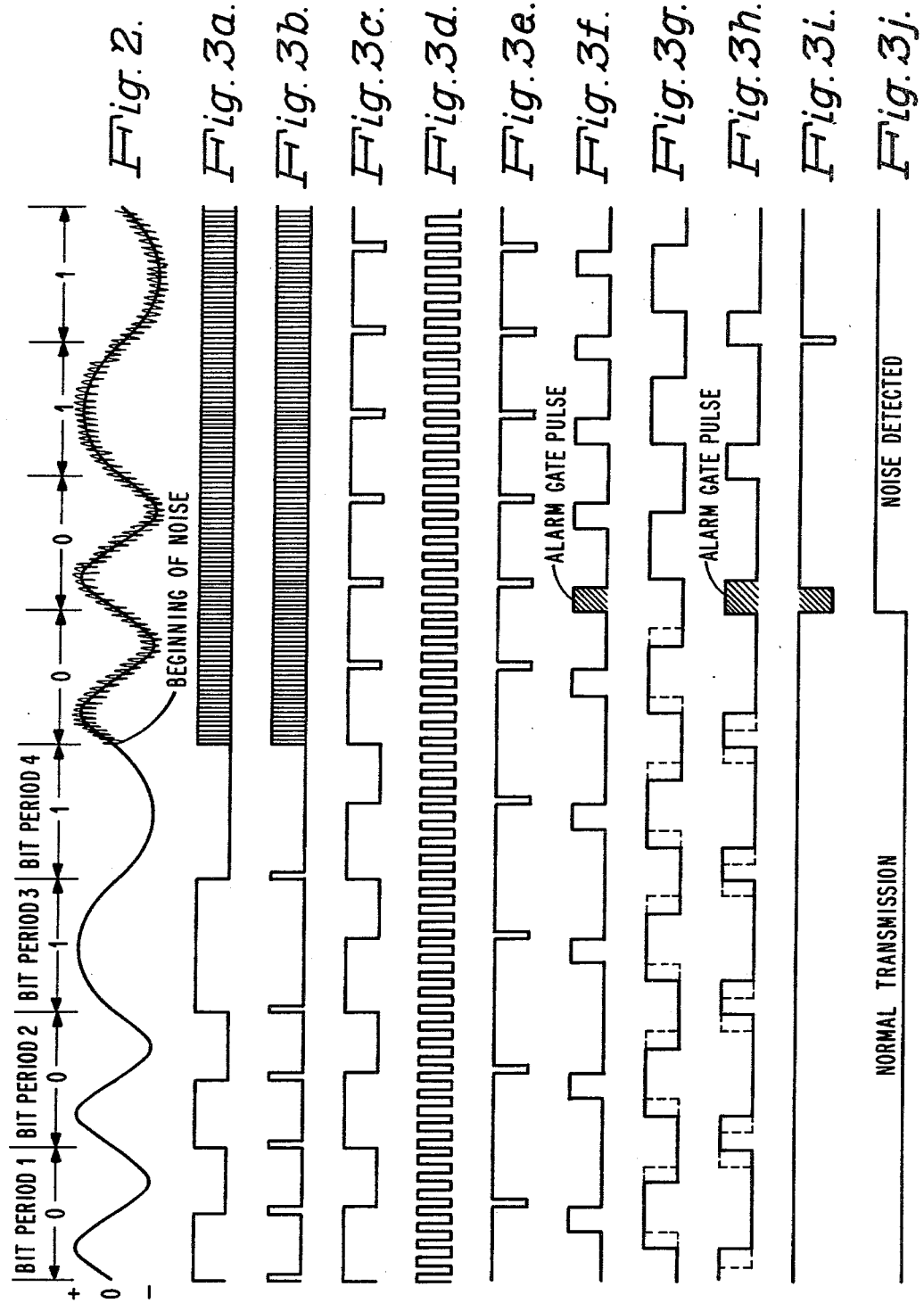

NOISE DETECTION CIRCUIT

The invention herein described was made in the course of a contract with the Department of the Army.

CROSS-REFERENCE TO RELATED APPLICATION

In co-pending patent application Ser. No. 899,922 filed Apr. 26, 1978, now U.S. Pat. No. 4,135,166 in the name of Charles R. Marchetti, and entitled MASTER TIMING GENERATOR, there is described and claimed a master timing generator which may be employed with the noise detection circuit of the present invention.

BACKGROUND OF THE INVENTION

The present invention relates to a noise detection circuit and, more particularly, to a digital noise detection circuit for detecting the presence of noise in digital diphase data and for producing an alarm signal in response to the detection of such noise.

In present day communications and switching systems, especially those requiring a large number of precisely-timed operations, it is important that the timing of these operations be properly and correctly executed even in the presence of noise or other similar high-energy disturbances. By way of example, it is common in many digital communications and switching systems to provide a master timing generator from which all timing signals for the system are derived and which is phase locked to an external clock signal to insure that all of the timing signals derived from the master timing generator are in proper, precise time and phase relationship. The external clock signal which is employed by the master timing generator for phase locking purposes may be conveniently derived in one common approach by extraction from digital data such as digital diphase data having binary information encoded therein by means of standard conditioned diphase modulation techniques. If the external clock signal is corrupted by noise or other high-energy disturbances, the master timing generator will attempt to track the erroneous signal, thereby causing timing perturbations within the system and, consequently, causing serious synchronization problems within the system and degradation of the performance of the system. It is important in the above situation therefore that the presence of noise be quickly and readily detected so that the operation of the system can be altered during the presence of the noise or other appropriate measures taken to compensate for the presence of the noise.

Techniques employed heretofore for detection of noise in digital signals have been essentially analog in nature, employing analog filters and comparators. These analog components are susceptible to thermal effects and variations in component tolerances which can adversely affect the stability and accuracy of the noise detection circuitry. In addition, these components are relatively slow in operation and lack the level of sensitivity required to meet stringent high-frequency specifications of equipment such as master timing generators. Further, if it is desired to change the frequency of clock signals such as described hereinabove, it is necessary to reprogram the values of the analog components.

BRIEF SUMMARY OF THE INVENTION

In accordance with the present invention a noise detection circuit is provided which avoids the disadvantages and shortcomings of noise detection circuitry as discussed hereinabove. The noise detection circuitry in accordance with the invention includes a first circuit means operative to receive a binary encoded signal and to derive a recovered clock signal therefrom comprising a train of recovered clock pulses of fixed duration and further operative to derive a gate signal comprising a train of gate pulses each corresponding to a different one of the recovered clock pulses of the recovered clock signal. Each of the gate pulses produced by the first circuit means is applied to a first input of an alarm gate means.

A phase lock loop circuit means is coupled to the first circuit means and to a second input of the alarm gate means and includes a second circuit means operative to produce a phase lock signal of the same frequency as, but phase displaced with respect to, the recovered clock signal produced by the first circuit means. The phase lock signal comprises a series of pulses phase displaced with respect to the recovered clock pulses of the recovered clock signal. A phase circuit means included in the phase lock loop circuit means is coupled to the first circuit means and to the second circuit means and operates to detect the phase difference between the recovered clock signal produced by the first circuit means and the phase lock signal produced by the second circuit means and to alter the timing of the phase lock signal with respect to the recovered clock signal by an amount related to the extent of phase difference between the recovered clock signal and the phase lock signal. A third circuit means included in the phase lock loop circuit means is coupled to the second circuit means and to the second input of the alarm gate means and operates to receive the phase lock signal from the second circuit means and to derive therefrom an alarm gate signal comprising a series of gate pulses displaced with respect to the pulses of the phase lock signal. The pulses of the alarm gate signal are applied to the second input of the alarm gate means.

The alarm gate means as described hereinabove operates when gate pulses are applied to the first and second inputs thereof having a predetermined first relationship to each other to produce an alarm signal at an output thereof indicating that the binary encoded signal has noise associated therewith, and operates when gate pulses are applied to the first and second inputs thereof having a predetermined second relationship to each other to produce a second signal at its output indicating the absence of noise associated with the binary encoded signal.

BRIEF DESCRIPTION OF THE INVENTION

Various objects, features and advantages of a digital noise detection circuit in accordance with the invention will be apparent from the following description taken in conjunction with the accompanying drawing in which:

FIG. 1 is a block diagram of a digital noise detection circuit in accordance with the present invention;

FIG. 2 is a sinusoidal diphase signal having noise associated therewith to be detected by the digital noise detection circuit of FIG. 1; and FIGS. 3a–3j are waveforms of signals at different points in the digital noise detection circuit of FIG. 1.

DETAILED DESCRIPTION OF THE INVENTION

Referring now to FIG. 1, there is shown a digital noise detection circuit 1 in accordance with the present invention. The digital noise detection circuit 1 is arranged to detect noise associated with a sinusoidal diphase signal applied to an input terminal 3 and to produce an alarm signal at an output terminal 5 in response to detecting the noise associated with the diphase signal. As shown in FIG. 2, the sinusoidal diphase signal has a plurality of bit periods which are encoded by standard diphase modulation techniques to represent a particular combination of binary "ones" and "zeros". In FIG. 2, the sinusoidal diphase signal is shown as being affected by noise following the fourth bit period. The sinusoidal diphase signal as shown in FIG. 2 is applied to a zero crossing detector circuit 7 of standard design wherein each zero-axis crossing of the sinusoidal diphase signal is detected to produce a square wave digital diphase signal as shown in FIG. 3a having a transition corresponding to each zero axis crossing of the diphase signal. As may be noted from the right-hand portion of the waveform of FIG. 3a, following the fourth bit period, the substantial amount of noise associated with the sinusoidal diphase signal of FIG. 2 results in a substantial number of "noise" transitions in the square wave digital diphase signal of FIG. 3a.

The digital diphase signal as shown in FIG. 3a is applied jointly to a pair of monostable (one-shot) multivibrators 9 and 10 which are triggered, respectively, on the leading (positive-going) and trailing (negative-going) transitions of the digital diphase signal to produce narrow output pulses corresponding to the transitions of the digital diphase signal. These output pulses are applied to and combined by an OR logic gate 12 to produce a train of narrow output pulses as shown in FIG. 3b. Each output pulse from the OR gate 12 is applied to the clock input of a flip-flop 14 and causes the flip-flop 14 to operate in its set state and to produce an output signal at a first (high) level at a first output Q. This output signal, which is indicated in FIG. 3c, is applied to a multi-stage (e.g., six stage) shift register 15 and clocked therealong by means of input clock pulses applied to a clock input terminal 16. The input clock pulses applied to the shift register 15 are selected to have a frequency, as shown in FIG. 3d, of eight times the bit rate of the diphase data of FIG. 3a, that is, there are eight clock pulses for each bit period of the pulse train of FIG. 3a.

After each output signal at the Q output of the flip-flop 14 has been clocked along the shift register 15 for a total of five clock pulses, representing a point or total time slightly beyond the mid-point of a bit period, the state of the shifted signal in the shift register 15 after the fifth clock pulse is detected by a shift detect circuit 17 and a clear pulse as shown in FIG. 3e is produced by the shift detect circuit 17 and applied to a clear, or reset, input of the flip-flop 14. The clear pulse causes the flip-flop 14 to operate in its reset state as a result of which the output signal at the Q output switches from its first (high) level to a second (low) level as generally indicated in FIG. 3c. The output pulse train of FIG. 3c, comprising a series of pulses of fixed duration, accordingly represents a recovered clock signal, designated in FIG. 1 as RC, which is extracted or recovered from the digital diphase data shown in FIG. 3a. As shown in FIG. 1, this signal may be applied as an external clock signal to a master timing generator (not shown) and used thereby in any desired manner (for example, as described in the aforementioned co-pending application of C. R. Marchetti).

As the shift detect circuit 17 operates to detect each fifth shift operation of the shift register 15 as described hereinabove, a gate pulse as shown in FIG. 3f is derived from the fifth stage of the shift register 15 coterminously with a corresponding one of the pulses of the clock signal RC and applied to a first input of an alarm NAND logic gate 20. In the absence of any noise affecting the diphase signals as shown in FIGS. 2 and 3a, for example, as indicated by the first four bit periods of the diphase signals shown in FIGS. 2 and 3a, a second gate pulse (as shown in FIG. 3h) is produced by a digital phase lock loop circuit 22, to be described in detail hereinbelow, and applied to a second input of the alarm NAND gate 20. This second gate pulse is established, in a manner also to be described hereinbelow, to be phase displaced with respect to the gate pulse applied by the shift register 15 to the first input of the NAND gate 20. As a result, no alarm signal is produced by the NAND gate 20 and applied to the output terminal 5. As will be apparent hereinafter, an alarm signal is produced at the output terminal 5 only when gate pulses to the NAND gate 20 are in phase. Such an alarm signal may then be employed in conjunction with the aforementioned recovered clock signal RC of FIG. 3c to control the operation of external circuitry coupled to the noise detection circuit 1 (for example, a master timing generator as described in the aforementioned co-pending application of C. M. Marchetti).

The manner in which the phase lock loop circuit 22 establishes the aforementioned gate pulse at the second input of the NAND logic gate 20 during periods that the diphase signal is unaffected by noise will now be described in detail. As shown in FIG. 1, the recovered clock signal RC at the output Q of the flip-flop 14 is applied to a first input of a first EXCLUSIVE OR logic gate 30 and, similarly, the inverse of the recovered clock signal, designated $\overline{RC}$ and appearing at the output $\overline{Q}$ of the flip-flop 14, is applied to a first input of a second EXCLUSIVE OR logic gate 32. A binary counter 34, typically comprising eight stages, is coupled to second inputs of the EXCLUSIVE OR gates 30 and 32 and operates to count input clock pulses as received from the clock input terminal 16. As the binary counter 34 operates to count input clock pulses, the output of one of the stages of the binary counter 34, specifically, the third stage, is a signal of the same frequency as the recovered clock signal RC (and the inverse signal $\overline{RC}$) as derived from the flip-flop 14 and is applied in common to the second inputs of the EXCLUSIVE OR gates 30 and 32. The signal from the third stage of the counter 34, designated PL in FIG. 1 and shown in FIG. 3g, is phase displaced with respect to the recovered clock signal RC (and the signal $\overline{RC}$) and is compared in phase with the signals RC and $\overline{RC}$ by the gates 30 and 32.

The EXCLUSIVE OR gates 30 and 32 operate in response to the signals RC, $\overline{RC}$ and PL applied thereto to produce output signals representative of the phase displacement between the compared signals RC, PL and $\overline{RC}$, PL which are then filtered by respective R/C filters 35 and 36 to derive dc voltages representative of the degree of phase displacement between the signals RC, PL and $\overline{RC}$, PL. These dc voltages are then applied to corresponding inputs of a comparator circuit 38. The comparator circuit 38 operates to determine which of its inputs is more positive and produces a binary 0 output when the dc voltage produced by the filter 35 is greater than that produced by the filter 36, indicating that the recovered clock signal RC leads the signal PL (or the signal $\overline{RC}$ lags the signal $\overline{PL}$), and produces a binary 1 output when the dc voltage produced by the filter 36 is greater than that produced by the filter 35, indicating that the recovered clock signal RC lags the signal PL (or the signal $\overline{RC}$ leads the signal $\overline{PL}$). The output of the comparator circuit 38 is applied directly to a first input of a first NAND logic gate 40 and, after inversion by an inverter circuit 41, to a first input of a second NAND logic gate 42. The NAND gates 40 and 42 are employed to respectively advance or retard the count in the counter 34 to alter the timing of the signal PL and thereby alter the phase relationship between the signals RC, PL and $\overline{RC}$, $\overline{PL}$. The phase changes can be effected, however, only when the diphase signals (FIGS. 2 and 3a) are unaffected by noise, as shown, for example, in the first four bit periods of the diphase signals of FIGS. 2 and 3a, and in addition, the binary counter 34 contain its maximum count, typically a count of 512. The count of 512 is selected to be compatable with the time constants of the R/C filters 35 and 36. In the absence of noise affecting the diphase signals, a re-triggerable monostable (one shot) multivibrator 45 connected to the output of the NAND gate 20 is in an untriggered state, and an inhibit circuit 47 coupled to the monostable multivibrator 45 detects this state and causes a binary 1 signal to be applied in common to second inputs of the NAND gates 40 and 42. When the binary counter 34 contains its maximum count (e.g., 512), representing the second condition for operation of either one of the NAND gates 40 and 42, this maximum count is detected by a full count detector circuit 49 which thereupon sets a flip-flop 50 and causes a binary 1 signal to be established at a $\overline{Q}$ output thereof and to be applied in common to third inputs of the NAND gates 40 and 42.

With the inhibit circuit 47 producing its binary 1 output and the counter 34 containing its maximum count of 512, when the output of the comparator circuit 38 is a binary 1, indicating that the recovered clock signal RC lags the signal PL (or the signal $\overline{RC}$ leads the signal $\overline{PL}$), the NAND gate 40 produces an output signal which is applied to a pre-load input of the binary counter 34. This output signal causes the counter 34 to be advanced from its maximum count of 512 to a count of 2, representing a phase shift of ⅛ of a bit period in the signal PL. When the output of the comparator circuit 38 is a binary 0, indicating that the recovered clock signal RC leads the signal PC (or the signal $\overline{RC}$ lags the signal $\overline{PL}$), the NAND gate 42 produces an output signal which is applied to a clear input of the binary counter 34. This output signal causes the counter 34 to be reset from its maximum count of 512 to 0, and delay the count for one clock period, again representing a phase shift of ⅛ of a bit period in the signal PL. With the particular frequency selected for the input clock pulses (FIG. 3d), that is, eight times the bit period rate, an output signal produced by either of the NAND gates 40 and 42 causes a phase shift of ⅛ of a bit period during a 32-bit period. The above operation of the phase lock loop circuit 22 can continue through several cycles, in one direction or the other, until the signals RC, PL and $\overline{RC}$, $\overline{PL}$ have the desired phase relationship, typically an average phase displacement of about 90°. When the desired phase relationship is established, representing an equilibrium state, the phase lock loop circuit 22 operates to make corrections about this equilibrium state, alternately in one direction and then the other every 32 bit periods. This condition is indicated in dotted line fashion in FIG. 3g.

As the above phase lock loop operations take place, the PL signal derived from the binary counter 34 is also applied to a multi-stage shift register 52 (e.g., three stages) and clocked therealong by means of input clock pulses at the clock input terminal 16. When the signal PL has been shifted to a preselected position in the register 52, for example, after two input clock pulses, this condition of the signal PL in the shift register 52 is detected by a shift detector circuit 54 and a pulse as shown in FIG. 3h is applied to the second input of the NAND gate 20. The timing of the pulse applied to the second input of the NAND gate 20 is established so that, in the absence of noise affecting the diphase signals (FIGS. 2 and 3a), it is out of phase with a pulse applied to the first input of the NAND gate 20 via the shift register 15. Accordingly, no output signal is produced under these circumstances by the NAND gate 20, the retriggerable monostable multivibrator 45 is not triggered, and no alarm signal is produced at the output terminal 5.

The manner in which an alarm signal is produced because of the presence of noise affecting the diphase signals is as follows. At such time as noise affectes the diphase signals, as shown, for example, following the fourth bit periods of the diphase signals of FIGS. 2 and 3a, the pulses of the recovered clock signal RC (FIG. 3c) produced at the Q output of the flip-flop 14 become much closer together with the result that the pulses at the fifth stage of the shift register 15 increase in frequency. After a short period of time, equivalent to about a few bit periods, one of the pulses from the shift register 15 is applied to the first input of the NAND gate 20 at a time so that it is in phase with a pulse from the shift detector circuit 54. An output pulse such as shown in FIG. 3i is accordingly produced by the NAND gate 20. This output pulse triggers the monostable multivibrator 45 causing it to produce an alarm signal as shown in FIG. 3j at the output terminal 5. The multivibrator 45 is selected to have a relatively long time constant (e.g., 300 msec) to insure that the alarm signal is of sufficient duration. The alarm signal may be used in any desired manner by external equipment such as the aforementioned master timing generator.

The alarm signal produced by the monostable multivibrator 45 is also detected by the inhibit circuit 47, by virtue of a change in its output from its previous binary 1 state to a binary 0 state, and the binary 0 output is applied to the second inputs of the NAND gates 40 and 42. The NAND gates 40 and 42 are accordingly inhibited by this binary 0 state thereby inhibiting the phase correction operation of the phase lock loop circuit 22 and "freezing" the phase of the signal PL. The binary counter 34, however, continue to count input clock pulses from the clock input terminal 16 in the previously described manner. Once the noise affecting the diphase signals disappears, the phase lock loop operation of the phase lock loop circuit 22 recommences and proceeds in the same manner as earlier described.

By virtue of the fact that the noise detector circuit 1 as described above is digital in nature, changes in operating frequency can be readily achieved without reprogramming the components of the circuit. Thus, for example, if the data rate of the diphase signals is changed, it is only necessary to change the frequency of clock pulses to accommodate the new data rate. The components of the noise detection circuit 1 do not have to be changed or reprogrammed as would be required of analog components.

While there has been described what is considered to be a preferred embodiment of the invention it will be apparent to those skilled in the art that varous changes and modifications may be made therein without departing from the invention as called for in the appended claims.

What is claimed is:

1. A noise detection circuit for detecting noise associated with a binary encoded signal and for producing an alarm signal in response to the detection of such noise, said noise detection circuit comprising:

first circuit means operative to receive said binary encoded signal and to derive a recovered clock signal therefrom comprising a train of recovered clock pulses of fixed duration and further operative to derive a gate signal comprising a train of gate pulses each corresponding to a different one of the recovered clock pulses of the recovered clock signal;

alarm gate means having a first input, a second input, and an output, each of the gate pulses produced by the first circuit means being applied to the first input of the alarm gate means;

phase lock loop circuit means coupled to the first circuit means and to the second input of the alarm gate means and comprising:

second circuit means operative to produce a phase lock signal of the same frequency as, but phase displaced with respect to, the recovered clock signal produced by the first circuit means, said phase lock signal comprising a series of pulses phase displaced with respect to the recovered clock pulses of the recovered clock signal;

phase circuit means coupled to the first circuit means and to the second circuit means and operative to detect the phase difference between the recovered clock signal produced by the first circuit means and the phase lock signal produced by the second circuit means and to alter the timing of the phase lock signal with respect to the recovered clock signal by an amount related to the extent of phase difference between the recovered clock signal and the phase lock signal; and third circuit means coupled to the second circuit means and to the second input of the alarm gate means and operative to receive the phase lock signal from the second circuit means and to derive therefrom an alarm gate signal comprising a series of gate pulses phase displaced with respect to the pulses of the phase lock signal, the pulses of said alarm gate signal being applied to the second input of the alarm gate means;

said alarm gate means being operative when gate pulses are applied to the first and second inputs having a predetermined first relationship to each other to produce an alarm signal at its output indicating that the binary encoded signal has noise associated therewith, and operative when gate pulses are applied to the first and second inputs having a predetermined second relationship to each other to produce a second signal at its output indicating the absence of noise associated with the binary encoded signal.

2. A noise detection circuit in accordance with claim 1 wherein:

the first circuit means is operative when the binary encoded signal has noise associated therewith to alter the spacing between the pulses of the recovered clock signal.

3. A noise detection circuit in accordance with claim 1 further comprising:

fourth circuit means coupled to the output of the alarm gate means and to the second circuit means and operative in response to an alarm signal produced by the alarm gate means to inhibit the second circuit means from altering the timing of the phase lock signal with respect to the recovered clock signal for the duration of the alarm signal.

4. A noise detection circuit in accordance with claim 1 wherein the alarm gate means is operative to produce an alarm signal at its output when gate pulses are applied to its inputs in phase and to produce the second signal at its output when gate signals are applied to its inputs which are not in phase.

5. A noise detection circuit in accordance with claim 4 wherein the second circuit means comprises:

counter means having a clock input and being operative to receive and count input clock pulses at said clock input and to produce a phase lock signal at a predetermined output thereof which is of the same frequency, but phase displaced with respect to, the recovered clock signal produced by the first circuit means;

and wherein the third circuit means comprises:

shift register means having an input for receiving each pulse of the phase lock signal produced by the counter means and a clock input for receiving input clock pulses for shifting each said pulse of the phase lock signal along the shift register means; and shift detector circuit means coupled to the shift register means and operative when each said pulse of the phase lock signal has been shifted to a predetermined location in the shift register means to produce a gate pulse phase displaced with respect to the pulse of the phase lock signal and to apply said gate pulse to the second input of the alarm gate means.

6. A noise detection circuit in accordance with claim 5 further comprising:

inhibit circuit means coupled to the output of the alarm gate means and operative in response to a second signal produced by the alarm gate means indicating the absence of noise associated with the binary encoded signal to produce a gate output signal;

and wherein:

the counter means is operative to count up to a predetermined maximum number of clock pulses; and the phase circuit means comprises:

phase detector circuit means operative to receive the recovered clock signal produced by the first circuit means and the phase lock signal produced by the counter means and to produce a first signal when the recovered clock signal and the phase lock signal are phase displaced with respect to each other in a first direction and to produce a second signal when the recovered clock signal and the phase lock signal are phase displaced with respect to each other in a second, opposite direction;

full detect circuit means coupled to the counter means and operative to produce an output signal when the counter means contains the predetermined maximum count;

first logic circuit means coupled to the phase detector circuit means, the inhibit circuit means, the full detect circuit means and the counter means, said first logic circuit means being operative in response to receiving a first signal from the phase detector circuit means, a gating output signal from the inhibit circuit means and an output signal from the full detect circuit means to alter the count of the counter means in a direction to shift the phase lock signal with respect to the recovered clock signal produced by the first circuit means in a direction opposite to that which resulted in the first signal being produced by the phase detector circuit means; and second logic circuit means coupled to the phase detector circuit means, the inhibit circuit means, the full detect circuit means and the counter means, said second logic circuit means being operative in response to receiving a second signal from the phase detector circuit means, a gating output signal from the inhibit circuit means and an output signal from the full detect circuit means to alter the count of the counter means in a direction to shift the phase lock signal with respect to the recovered clock signal produced by the first circuit in a direction opposite to that which resulted in the second signal being produced by the phase detector circuit means.

7. A noise detection circuit in accordance with claim 6 wherein:

the inhibit circuit means is further operative in response to an alarm signal produced by the alarm gate means indicating the presence of noise associated with the binary encoded signal to produce an inhibit output signal, said inhibit output signal being applied in common to the first and second logic circuit means; and each of said first and second logic circuit means being operative in response to an inhibit output signal produced by the inhibit circuit means to be inhibited from altering the count of the counter means and, therefore, the timing of the phase lock signal produced by the counter means.

8. A noise detection circuit in accordance with claim 5 wherein:

the first circuit means comprises:

transition detection circuitry means operative to receive the binary encoded signal and to produce a signal comprising a series of pulses each corresponding to a different one of the transitions of the binary encoded signal;

flip-flop means coupled to the transition detection circuitry means and operative in response to each pulse of the signal produced by the transition detection circuitry means to operate in a first state, and to produce a recovered clock signal at an output thereof at a first level;

shift register means coupled to the flip-flop means and operative to receive each recovered clock signal of the first level produced by the flip-flop means together with input clock pulses and in response to said input clock pulses to shift said recovered clock signal therealong; and shift detection circuit means coupled to the shift register means and to the flip-flop means and operative when each recovered clock signal at the first level produced by the flip-flop means has been shifted to a particular location within the shift register means to cause the flip-flop means to operate in a second state thereby to cause the recovered clock signal produced thereby to switch from its first level to a second level, thereby to produce a resulting recovered clock pulse having a predetermined fixed width.

9. A noise detection circuit in accordance with claim 8 wherein the transition detection circuitry comprises:

first monostable multivibrator means operative to receive the binary encoded signal and to produce an output pulse corresponding to each transition of the binary encoded signal in a first direction;

second monostable multivibrator means operative to receive the binary encoded signal and to produce an output pulse corresponding to each transition of the binary encoded signal in a second direction; and OR gate means coupled to the first and second monostable multivibrator means and operative to combine the output pulses produced by the first and second monostable multivibrator means into a single train of output pulses.

10. A noise detection circuit in accordance with claim 6 wherein:

the first circuit means is further operative to derive from the binary encoded signal an additional clock signal representing the inverse of the recovered clock signal;

and wherein the phase detector circuit means comprising:

first and second phase detector gate means operative to receive, respectively, the recovered clock signal and the inverse recovered clock signal produced by the first circuit means and to receive in common the phase lock signal produced by the counter means, said first phase detector gate means being operative to detect the phase displacement between the recovered clock signal and the phase lock signal and to produce an output signal indicative of the extent of the phase displacement between the pair of signals received thereby, and said second phase detector gate means being operative to detect the phase displacement between the inverse recovered clock signal and the phase lock signal and to produce an output signal indicative of the extent of phase displacement pair of signals received thereby;

first and second filter means coupled, respectively, to the first and second phase detector gate means and operative in response to the output signals produced by the first and second phase detector gate means to produce voltages having values related to the extent of phase displacement between the pairs of signals applied to the first and second phase detector gate means; and comparator circuit means coupled to the first and second filter means and operative when the voltages produced by the first and second filter means bear a predetermined first relationship to each other to produce a first output signal indicative of a first set of phase relationships between the pairs of signals applied to the first and second phase detector gate means, and operative when the voltages produced by the first and second filter means bear a predetermined second relationship to each other to produce a second output signal indicative of a second set of phase relationships between the pairs of signals applied to the first and second phase detector gate means.

11. A noise detection circuit in accordance with claim 10 wherein:
the alarm gate means includes a NAND logic gate; and
each of the first and second phase detector gate means includes an EXCLUSIVE OR gate.

* * * * *